United States Patent
Hashimoto et al.

(10) Patent No.: US 6,372,158 B1
(45) Date of Patent: Apr. 16, 2002

(54) CONDUCTIVE PASTE

(75) Inventors: Akira Hashimoto, Kyoto; Takeo Yasuho, Osaka; Masaaki Hayama, Nara; Kazuhiro Miura, Osaka, all of (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/696,687

(22) Filed: Oct. 26, 2000

(30) Foreign Application Priority Data

Oct. 29, 1999 (JP) .............................. 11-309300

(51) Int. Cl.[7] .................................. H01B 1/22
(52) U.S. Cl. ................ 252/514; 252/519.2; 252/519.21
(58) Field of Search .................. 252/512, 514, 252/519.2, 519.21

(56) References Cited

U.S. PATENT DOCUMENTS

| | | | | |
|---|---|---|---|---|
| 4,636,332 A | * | 1/1987 | Craig et al. | 252/514 |
| 5,059,242 A | * | 10/1991 | Firmstone et al. | 106/1.23 |
| 5,795,501 A | * | 8/1998 | Kano | 252/514 |
| 5,891,283 A | * | 4/1999 | Tani et al. | 156/89.18 |
| 5,997,774 A | * | 12/1999 | Shimizu et al. | 252/514 |

* cited by examiner

*Primary Examiner*—Mark Kopec
(74) *Attorney, Agent, or Firm*—Parkhurst & Wendel, L.L.P.

(57) ABSTRACT

A paste of the present invention comprises a precious metal organic acid salt added to precious metal powder as a precious metal component of the conductive paste. The base metal organic acid salts are also used instead of base metal components in the inorganic binders to exclude particles with larger diameters from the conductive paste. The conductive paste of the present invention allows the lumps in the paste caused by the insufficient dispersion to be 10 μm Φ or less, thereby remarkably reducing the screen blockage during screen printing of wiring pattern of 100 μm or less in width.

6 Claims, 3 Drawing Sheets

CONDUCTIVE PASTE

FIELD OF THE INVENTION

The present invention relates to a conductive paste used for improving fine pattern printing properties during the printing process of ceramic thick film printed circuit board.

BACKGROUND OF THE INVENTION

In recent years, electronic components have been required to reduce in size and weight to accommodate to mobile phones and compact office automation devices. In the field of ceramic thick film printed circuit board, lamination methods including the green sheet laminating method have been utilized to meet the needs of high-density printed circuit boards such as micro chip module (MCM) and chip size package (CSP).

In the chip component field as well, highly multi-layered electronic components such as chip capacitors and chip inductors have been used widely in order to satisfy the need to reduce the size of chips. In the manufacturing process of chip resistors and other screen printing processes, introduction of high definition screen masks and pastes with superior printing properties have promoted fine pattern printing.

Chip components manufactured by using the intaglio transfer printing technology capable of fine printing have been commercialized. Against this background, the number of printing processes has increased for the manufacturing of multiple laminated components used for highly-density printed circuit boards. Furthermore, the intaglio transfer printing method is costly since it requires expensive materials such as intaglio.

Conventional thick film conductive pastes are manufactured by mixing powders of conductive materials (precious metal materials) and inorganic binders (glass frit and additives) with an organic vehicle made by dissolving ethyl cellulose or the like resins in an organic solvent such as α-terpineol, and by kneading the mixture to form a paste. When the powder and the organic vehicle are mixed, viscous lumps of 30–50 μm Φ are generated due to a lack of dispersion.

In conventional screen printing methods, the width of wiring has been typically between 250–300 μm. For a screen mask, a stainless steel screen of 200–325 mesh has been used. The screen mask of 200–325 mesh has openings of 50–80 μm, thus the lumps caused by the lack of dispersion mentioned above have not caused any problems in terms of passing through the mesh.

In finer screen printing of recent years, a stainless steel mesh of 400–600 mesh has been required to form a wiring of 100 μm in width, reducing the size of the openings of the mesh to 27–40 μm Φ. Due to this, passing of the lumps caused by the insufficient dispersion has been, in some cases, hampered, allowing the lumps to remain on the stainless steel mesh without being printed, thereby making the printed pattern defective.

With reference to FIGS. 3A and 3B, the aforementioned phenomenon is described. FIGS. 3A and 3B are schematic views in which patterns are printed with conductive paste using screen masks. As FIG. 3A shows, when paste disperses well, a cross section of the conductive paste printed on a substrate 21 by screen printing, is like a printed layer 24. In other words, when the paste disperses well, hardly any paste remains on a screen mesh 22 and a side wall of a masking emulsion 23.

As FIG. 3B shows however, when lumps are generated in the paste due to insufficient dispersion, lumps 25 of the conductive paste block the screen mesh 22 during screening printing, causing a defective recess in the printed layer 24. When a defective recess 26 grows larger, it triggers breaking of conductive film.

As thus far described, in the case of the conventional pastes such as Ag—Pd and Ag—Pt pastes containing fine particles of Pd or Pt of smaller than 0.5 μm Φ, fine particles do not disperse sufficiently, causing lumps of 30–50 μm in size, which are more viscous than the paste, to be generated. Even when additives such as inorganic binders including bismuth oxide, copper oxide and zinc oxide for making the printed conductive film more tightly fixed to the substrate are sieved by a mesh, particles with larger diameters can not be removed. Thus those particles block the screen mask during screen printing. When a screen mask of 400–600 mesh is used during screen printing to form a wiring of not more than 100 μm in width, the lumps in the paste, caused by insufficient dispersion or inorganic binders containing particles of larger diameter are trapped in the openings of the mesh of the screen mask, causing a defect in the printed layer.

As an alternative paste, metallic resinates, thin-film forming pastes containing organic acid salts of precious metals, have been conventionally used. These resinates are produced by reacting, for example, rosin (resin of pine trees) with metallic chlorides. These pastes do not contain solid powder and, thus do not block the mesh during printing. However, the film formed with those pastes is only about 0.1 μm in thickness and, thus can not be used for common thick film printed circuit board.

The present invention aims at providing a conductive paste for fine pattern printing used in the printing process of ceramic thick film printed circuit boards. Conductive particles used in the conductive paste of the present invention are approximately spherical. The conductive paste further includes organic acid salts of precious metal instead of fine particles of Pd or Pt which do not disperse sufficiently when used in a conductive paste, in order to improve the passing of the paste through high-mesh screen masks.

SUMMARY OF THE INVENTION

According to the present invention, precious metal organic acid salts and precious metal powder are both used as precious metal components of a conductive paste. The base metal organic acid salts are also used as base metal components in the conductive paste in order to exclude particles with larger diameters from the conductive paste. The conductive paste of the present invention allows the lumps in the paste caused by the insufficient dispersion to be not more than 10 μm Φ, thereby remarkably reducing the blocking occurring during screen printing of wiring pattern of 100 μm or less.

BRIEF DESCRIPTION OF THE DRAWINGS

FIG. 2(*b*) is a schematic view showing the sintered state of FIG. 2(*a*).

FIG. 2(*c*) is a schematic view showing an improved conductive film after sintering.

DETAILED DESCRIPTION OF THE INVENTION

Figure 1:
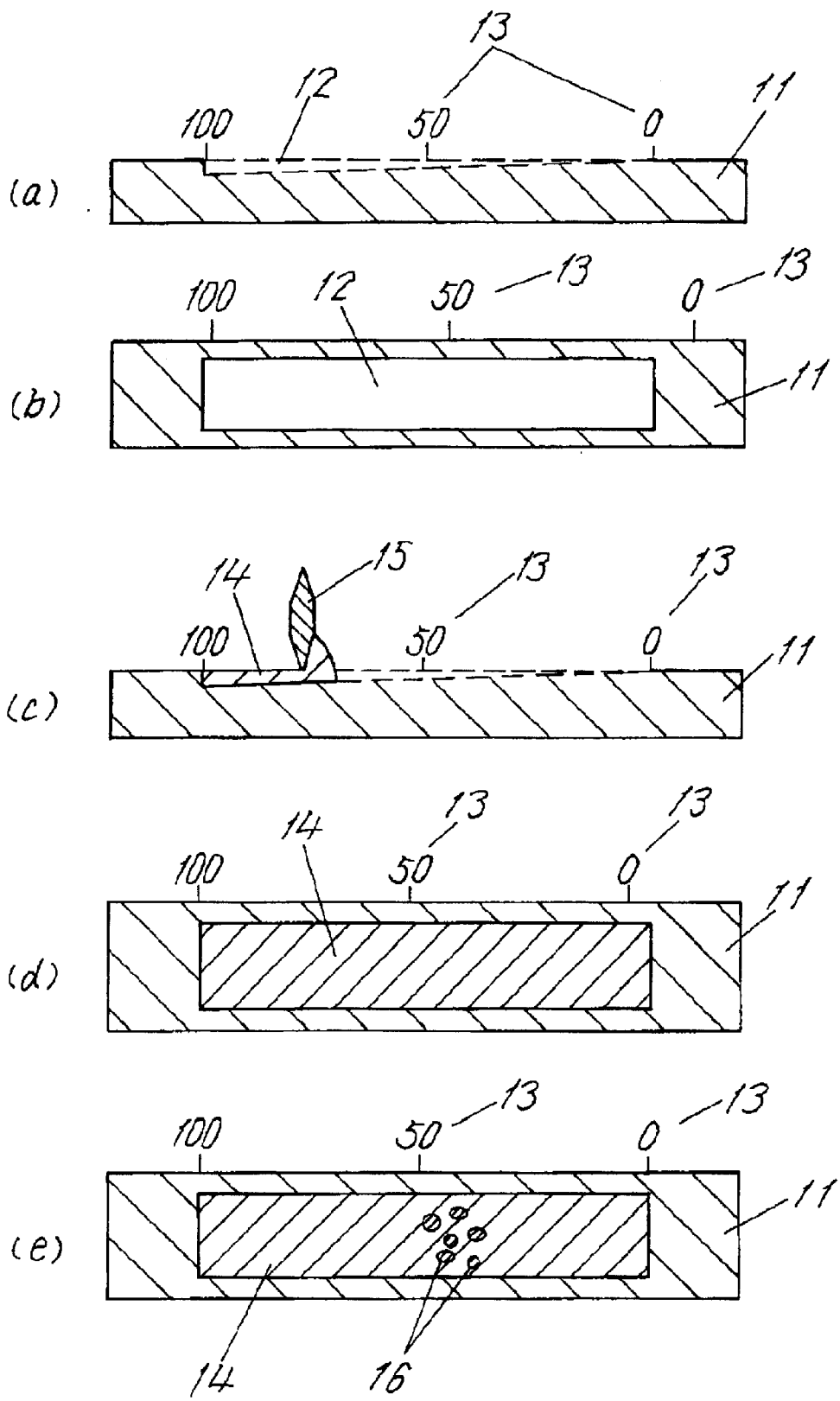
FIG. 1 illustrates a method of testing defective dispersion using a grind gauge.
Figure 2:
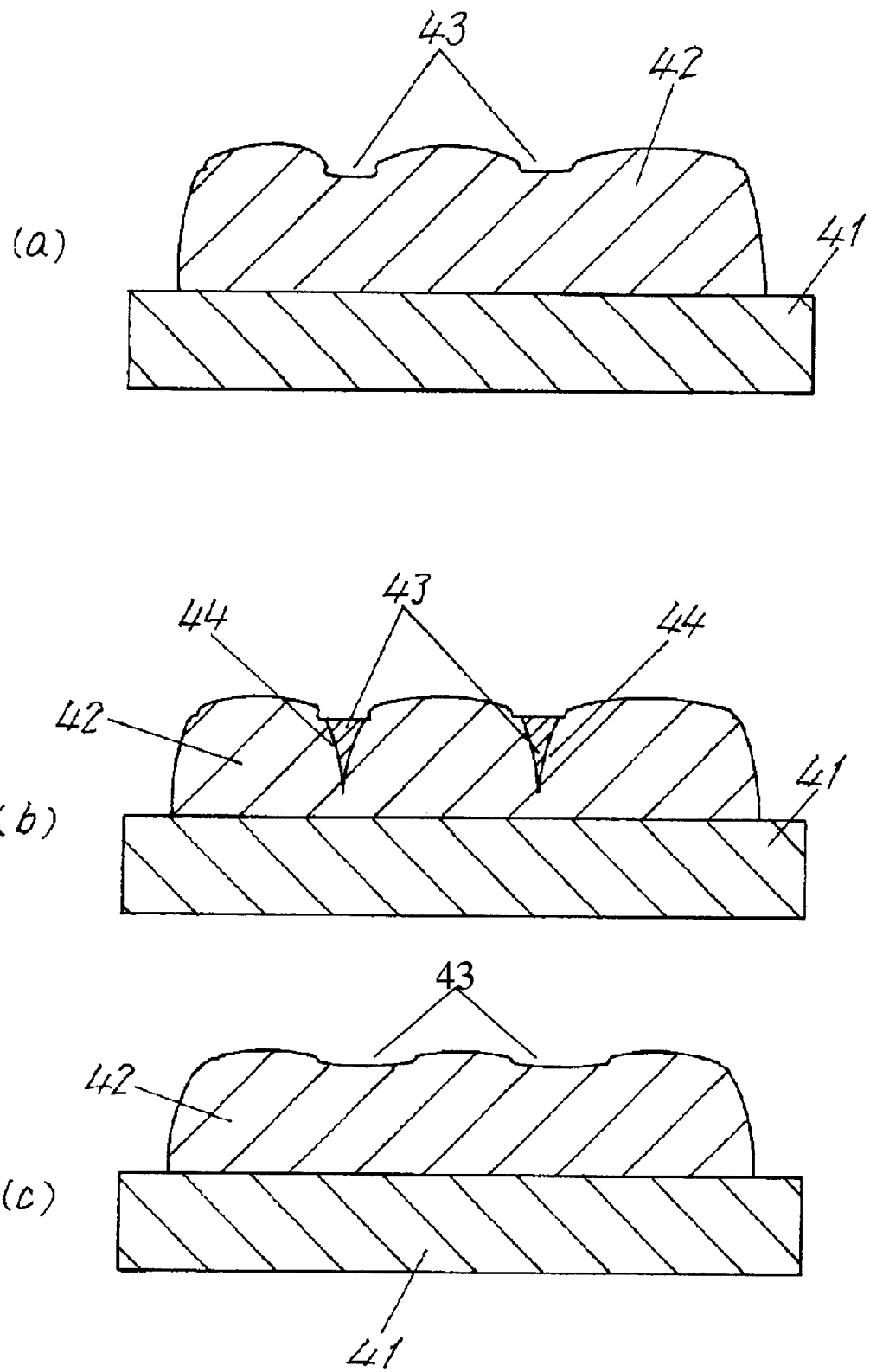
FIG. 2(*a*) is a schematic view showing the dried conductive film formed by printing a conductive paste according to a preferred embodiment of the present invention.
Figure 3A:
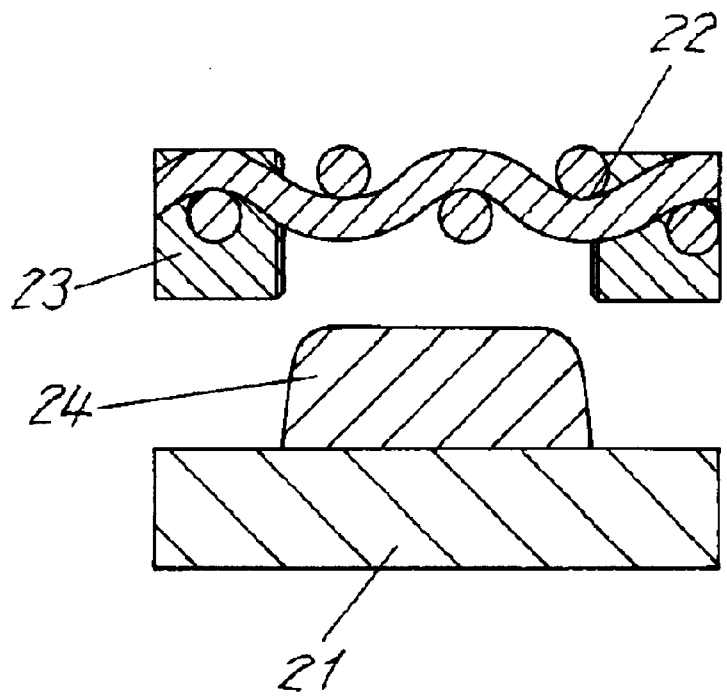
FIG. 3A is a schematic view showing a printed pattern in a good condition.
Figure 3B:
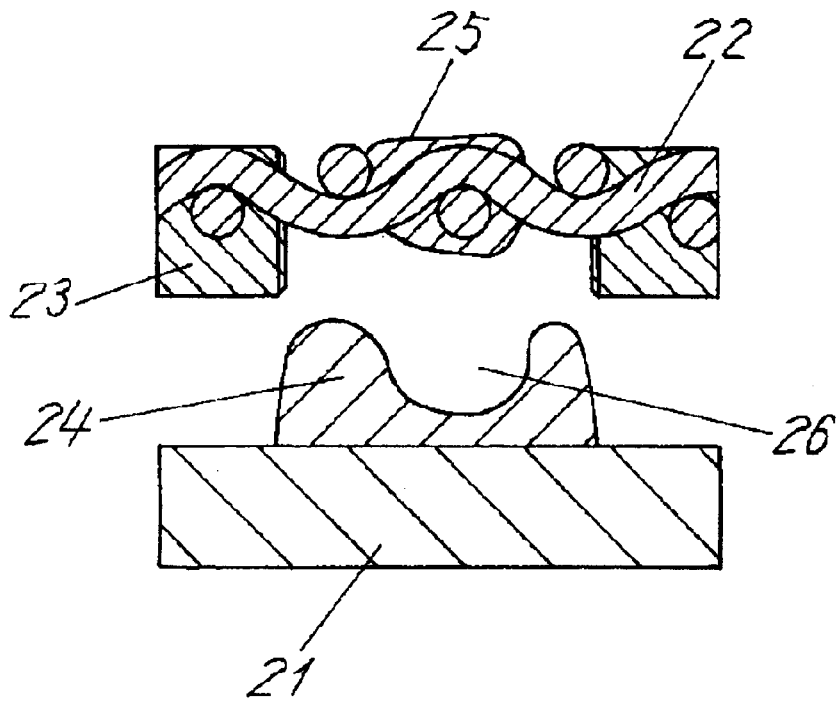
FIG. 3B is a schematic view showing a defective printed layer caused by insufficient dispersion of the paste.

With reference to FIGS. 1 and 2, the preferred embodiments of the present invention are described below.

First Preferred Embodiment

A first manufacturing process of Ag—Pd paste is schematically described below.

First, the following materials are prepared:

1. conductive components; spherical Ag powder of 2–3 μm in diameter as a main component, and Pd resinate;
2. inorganic binder material; inorganic powder of such materials as bismuth oxide, copper oxide and zinc oxide; and
3. organic binder (ethyl cellulose) and organic solvent (α-terpineol).

These materials are then weighed and mixed. Subsequently, the mixture is mixed further and kneaded by automatic mortar or a three roll mill, and then filtered to produce a conductive paste. In this embodiment, silver powder is used as a main component of the conductor. Ag—Pt paste can also be produced by using Pt resinate instead of Pd resinate as a component of the conductor.

The Second Preferred Embodiment

A second manufacturing process of Ag—Pd paste is schematically described below. Based on the first preferred embodiment, as an inorganic binder material, resinates of respective metals are used instead of bismuth oxide, copper oxide or zinc oxide powder. The materials are then weighed and mixed. The mixture is then further mixed and kneaded by automatic mortar or a three roll mill, and subsequently filtered to produce a conductive paste. In this embodiment, silver powder is used as a main component of the conductor. However, if Pt resinate is used instead of Pd resinate as a component of the conductor, Ag—Pt paste can be produced.

The Third Preferred Embodiment

A third manufacturing process of Ag—Pd paste is schematically described below. First, the following materials are prepared:

1. conductive components: spherical Ag powder of 2–3 μm in diameter as a main component, Pd resinate and Ag or Au resinate;
2. inorganic binder material: powder of such materials as bismuth oxide, copper oxide and zinc oxide; and
3. organic binder (ethyl cellulose) and organic solvent (α-terpineol).

The materials are weighed and mixed. The mixture is then further mixed and kneaded by automatic mortar or a three roll mill, and subsequently filtered to produce a conductive paste. If Pt resinate is used instead of Pd resinate as a component of the conductor, Ag—Pt paste can be produced.

The Fourth Preferred Embodiment

A fourth manufacturing process of Ag—Pd paste is schematically described below. First, in addition to the materials used in the first, second and third preferred embodiments, polyvinyl butyral is further added as an organic binder. The materials are weighed and mixed. The mixture is then further mixed and kneaded by automatic mortar or a three roll mill, and subsequently filtered to produce a conductive paste. If Pt resinate is used instead of Pd resinate as a component of the conductor, Ag—Pt paste can be produced.

In the first through fourth preferred embodiments, if Au powder is used instead of Ag powder as a component of the conductor, Au—Pt and Au—Pt pastes can be produced.

In the aforementioned description, as a precious metal or as a base metal component, the metal resinate is used, however, instead of the metal resinate, organic acid salts of the foregoing metals such as metal naphthenate and metal octylate may be used. Common metallic soaps available on the market may be used as organic acid salts of base metals. Metals available for organic acid salts include such precious metals as Au, Ag, Pt, Rh, Ru and Pd.

Available organic acid salts of base metals include Na, Mg, Al, Si, Ka, Ca, Ti, V, Cr, Mn, Fe, Co, Ni, Cu, Zn, Sr, Zr, Nb, Mo, Cd, In, Sn, Sb, Cs, Ba, Ta, Pb and Bi.

An appropriate material can be selected from the foregoing materials according to the properties required of the conductive paste.

The preferred embodiments are described hereinafter in detail.

EXAMPLE 1

The following is the description of an Ag—Pd paste. First, the materials used for this example are described. Spherical Ag powder of 2–3 μm in diameter is used such that its content in the paste becomes 60–80% by weight. The spherical Ag powder can easily pass through the mesh of the screen mask during screen printing. Pd resinate (Pd content in the resinate being 5–15%) is used such that the content of Pd resinate in the paste becomes 5–20% by weight. As an inorganic binder, bismuth oxide, copper oxide and zinc oxide are used such that their contents in the paste are in a range of 2–6% by weight.

Organc binder (ethyl cellulose) is used such that its content in the paste is within a range of 1–5% by weight. As an organic solvent, a mixed solvent of α-terpineol, dibutyl phthalate, butyl carbitol acetate, and alkyl benzene is used such that its content in the paste is within the range of 10–20% by weight. The foregoing materials are mixed and kneaded by automatic mortar or a three roll mill. The paste is filtered with a 400 mesh stainless screen. Organic solvents are added to the filtered paste to adjust its viscosity.

The method of grind gauge test conducted for measuring a dispersion conditions of the paste is described in FIGS. 1(a)–(e). FIG. 1(a) is a side view of a grind gauge 11. In FIG. 1(a), the grind gauge 11 has a groove 12 and scales 13 which indicate the depth of the grooves. FIG. 1(b) is a top view of the grind gauge 11. The grind gauge shown in FIG. 1(b) has the groove 12 with a predetermined width, and on the surface of which is the scales 13 which show the depth of the groove. FIG. 1(c) is a side view of the grind gauge 11. In FIG. 1(c), a conductive paste 14 is placed on the deeper part of the groove 12 of the grind gauge 11, and a blade 15 placed vertically on the groove 12 is being moved to the shallower part of the groove 12. FIG. 1(d) is a top view showing the condition after the test, namely, after the blade 15 has moved completely to the shallow part of the groove 12. In FIG. 1(d), the groove 12 is filled with the conductive paste 14. FIG. 1(e) is a top view of the grind gauge 11. In FIG. 1 (e), the grind gauge shown in FIG. 1(d) is naturally dried. FIG. 1(e) shows lumps 16 formed due to insufficient dispersion of the conductive paste 14 filling the groove 12. The dispersion condition of the conductive paste 14 can be evaluated based on the locations of the lumps 16 of the conductive paste 14 shown in FIG. 1(e).

The composition of the paste and results of the evaluation are shown in Table 1 and 2.

TABLE 1

| Kind Of Paste | Components in the Paste | | | | Dispersion Condition of the Paste | |
|---|---|---|---|---|---|---|
| | Ag Component | Pd Component | Inorganic Component | Ag Resinate | Lumps | Maximum Particle Size |
| Example 1 | Powder | Pd Resinate | Powder | Not Used | 10 φ and Less | 15–25 φ |
| Example 2 | Powder | Pd Resinate | Resinate | Not Used | 10 φ and Less | 2 φ and Less |
| Example 3 | Powder | Pd Resinate | Resinate | Used | 10 φ and Less | 2 φ and Less |
| Prior Art | Powder | 0.5 μm Powder | Powder | Not Used | 30–50 φ | 15–25 φ |

Table 1 shows the comparison made of above mentioned test results between the conductive paste of Examples 1 and a conventional paste. The main components of the conventional paste such as Ag, Pd and inorganic binders are all in a powder form. On the contrary, roughly speaking, pastes of Example 1 uses Pd resinate in the conductive components instead of Pd fine-particle.

The evaluation in Table 1 of the dispersion condition is made in relation to two aspects. The "lumps formed by insufficient dispersion" is checked by the testing method shown in FIG. 1. The maximum particle size is evaluated based on a grind gauge test specified in the Japanese Industrial Standard. In comparison with the conventional paste, the size of the lumps formed by the insufficient dispersion of Example 1 is not more that 10 μm Φ. Hardly any difference in the maximum particle sizes of 15–25 μm Φ are measured by the grind gauge between the conventional paste and the Example 1. However, when they are used for printing, differences appear clearly between them. Improvements achieved by the conductive paste of the Example 1 are described below.

Table 2 shows the comparison made on the number of defects in screen printing, between the conductive paste of the Example 1 and that of other Examples and a conventional paste. As Table 2 shows, 30 defects caused by insufficient dispersion are found in the printed film of the conventional paste, whereas no such defects are observed with the paste of the Example 1 which uses Pd resinate as a Pd component.

| Kind of Paste | Number of Defects in Printing (Defect/Sheet) | |
|---|---|---|
| | Caused by Lumps Formed By Insufficient Dispersion | Caused by Powder Particles in the Paste |
| Example 1 | 0 | 3 |
| Example 2 | 0 | 0 |
| Example 3 | 0 | 0 |
| Prior Art | 30 | 4 |

Printing condition: screen mask 500 mesh
Designing rule: minimum line width/minimum spacing: 80 μm 50 μm
The number of defects: average of 10 successive printings.

The results indicate that the paste disperses more effectively, and thus more easily passes through the screen mesh. The foregoing results are that of Ag based paste, however, it is confirmed that Au based paste achieves the same effect. When Pd resinate is replaced with Pt resinate, the same effects are obtained.

EXAMPLE 2

In Example 2, Ag—Pd paste is described. In the paste composition of Example 1, Bi, Cu or Zn resinate (content of the metallic component of each resinate is 10–30%) are used instead of inorganic powder as inorganic binders in such a manner that the content of the resinate becomes within the range of 5–10% by weight.

Results of the test on the dispersion conditions of the paste using the grind gauge in the same manner as in Example 1 are shown in Table 1. As Table 1 shows, the maximum particle size of the paste of Example 2 is 2 μm and smaller, suggesting that coagulated particles of larger diameters can effectively be removed. Table 2 shows comparisons made on the number of screen printing defects, between the conductive paste of Example 2 and that of the other Examples and a conventional paste.

As Table 2 shows, defects in the printed film caused by both insufficient dispersion of the paste and by coagulated particles with larger diameters in the paste are totally removed. The results suggest that the conductive paste of Example 2 remarkably reduces screen printing defects in the printed film. The foregoing results are based on an Ag based paste, however, it is confirmed that Au based pastes achieve the same effect. When Pd resinate is replaced with Pt resinate, the same effects can be obtained.

EXAMPLE 3

In Example 3, Ag—Pd paste is described. First, the materials are described. In the paste composition of Example 2, Ag or Au resinate (content of the Ag or Au in resinate is 10–20%) is used in the paste in the range of 10–20% by weight.

Results of the test on the dispersion conditions of the paste using the grind gauge in the same manner as in Example 1 are shown in Table 1. As Table 1 shows, similar to Example 2, the maximum particle size of the paste of Example 3 is not more than 2 μm, suggesting that coagulated particles of larger diameters can effectively be removed. Table 2 shows the comparison made on the number of screen printing defects, between the conductive paste of Example 3 and that of the other Examples and a conventional paste.

As Table 2 shows, defects in the printed film caused by both insufficient dispersion of the paste and by coagulated particles with larger diameters in the paste are totally removed. The results suggest that the conductive paste of Example 3 remarkably reduces screen printing defects in the printed film.

With reference to FIG. 2(a), the effect of Ag or Au resinate further added in this Example is described. In FIG. 2(a), the conductive paste of Examples 1 or 2 is printed on a substrate 41 by screen printing to form a conductive film 42. A thinner part 43 of the conductive film 42 created by the mesh of the screen mask is shown in FIG. 2(a). When sintered, the thinner part 43 of the conductive film 42 shrinks, causing cracks 44 in FIG. 2(b) on the thinner part 43. In contrast when the conductive paste of Example 3 is used, the thinner part 43 of the conductive film 42 does not suffer cracks even after sintering the conductive film 42 as is shown in FIG. 2(c). This is because the Ag or Au resinate component functions as a buffer during sinter shrinking.

The foregoing results confirms that the paste of Example 3 provides a high quality conductive film which does not suffer cracks after sintering. The foregoing results are based on an Ag based paste, however, it is confirmed that Au based pastes achieve the same effect. When Pd resinate is replaced with Pt resinate, the same effects can be obtained.

EXAMPLE 4

In Example 4, Ag—Pd paste is described. In this Example, in addition to ethyl cellulose, polyvinyl butyral is used as an organic binder. The materials used in this Example are described. Spherical Ag powder of 2–3 µm in diameter which can easily pass through the mesh of the screen mask during screen printing, is used in the content of 60–80% by weight in the paste. Pd resinate (Pd content in the resinate being 5–15%) is used such that the content of Pd resinate in the paste becomes 5–20% by weight. As an inorganic binder, bismuth oxide, copper oxide and zinc oxide are used such that their contents in the paste is with in a range of 2–6% by weight. Ethyl cellulose is used in the paste within the range of 1–5% by weight. Further, as an organic binder, polyvinyl butyral is added in such a manner that its content in the paste is within a range of 0.5–2% by weight. As the organic solvent, a mixed solvent of α-terpineol, dibutyl phthalate, butyl carbitol acetate, and alkyl benzene, is used such that its content in the paste is within the range of 10–20% by weight. The foregoing materials are mixed and kneaded by automatic mortar or a three roll mill. The paste is filtered with a 400 mesh stainless screen. Organic solvents are added to the filtered paste to adjust its viscosity.

The effect of addition of polyvinyl butyral is described with reference to FIG. 2. As is the case with Example 3, polyvinyl butyral is used to restrict occurrence of cracks in the thinner part 43 of the conductive film 42 shown in FIG. 2(c) during sinter shrinking. In other words, shrinkage during sintering is reduced by adding polyvinyl butyral, thereby restricting cracks. However, when the amount of polyvinyl butyral added to the paste is not enough, no effect can be obtained, conversely, when the added amount is excessive, the conductive film 42 shown in FIG. 2 becomes porous. Considering these points, an optimum content of polyvinyl butyral in the paste is 0.5–2.0% by weight. The reason why the crack is reduced by adding polyvinyl butyral is thought that it makes the paste more fluid, thus preventing the occurrence of the thinner part 43 in the conductive film.

The foregoing results are based on an Ag based paste, however, it is confirmed that Au based pastes achieve the same effect. When Pd resinate is replaced with Pt resinate, the same effects can be obtained.

Further, the above result of adding polyvinyl butyral is explained regarding Example 1, though, the same effect was obtained even with the pastes of Examples 2 and 3.

As thus far described, when fine pattern printing is conducted by the screen printing method, by replacing powder components which badly affects the dispersion of the components in the conductive paste with metallic organic acid salts such as metallic resinate, the paste can pass through the screen mask of high mesh more easily. Thus, a fine pattern with hardly any defects can be obtained.

When Ag or Au organic acid salt is added to the conductive metallic powder, shrinkage of the printed film during sintering is restricted, thereby improving the leveling of the printed film. By adding polyvinyl butyral resin to the printing paste, the amount of shrinkage of the printed film during sintering can be controlled. Thus, a high quality printed film free of any cracks can be obtained.

What is claimed is:

1. A conductive paste for screen printing a line width narrower than 100 µm, said paste comprising:
   a spherical conductive powder having a particle diameter of 2 to 3 µm;
   one of Pd and Pt organic acid salts and additionally at least one of Au and Ag organic acid salts and additionally at least one of Au and Ag organic acid salts;
   an inorganic binder; and
   an organic binder.

2. The conductive paste of claim 1, wherein said organic acid salt is a metal resinate.

3. The conductive paste of claim 1, wherein said conductive powder is one of gold and silver.

4. The conductive paste of claim 1, further comprising at least one of organic acid salts of Bi, Cu and Zn, as an additive.

5. The conductive paste of claim 1, wherein said organic binder is ethyl cellulose.

6. The conductive paste of claim 5, further comprising polyvinyl butyral within a range of 0.5–2% by weight in the paste.

* * * * *